United States Patent
Shih

(10) Patent No.: US 11,476,200 B2
(45) Date of Patent: Oct. 18, 2022

(54) SEMICONDUCTOR PACKAGE STRUCTURE HAVING STACKED DIE STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/454,609

(22) Filed: Jun. 27, 2019

(65) Prior Publication Data

US 2020/0203282 A1 Jun. 25, 2020

Related U.S. Application Data

(60) Provisional application No. 62/782,712, filed on Dec. 20, 2018.

(51) Int. Cl.
*H01L 23/538* (2006.01)
*H01L 25/065* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 23/5383; H01L 23/5386; H01L 24/19; H01L 24/20;
(Continued)

(56) References Cited

U.S. PATENT DOCUMENTS 8,097,490 B1 1/2012 Pagaila et al.
8,736,065 B2 * 5/2014 Gonzalez ............... H01L 25/50
257/774

(Continued)

FOREIGN PATENT DOCUMENTS

CN 107305890 A 10/2017
TW 201739030 A 11/2017
WO WO-2018135349 A1 7/2018

OTHER PUBLICATIONS

Office Action dated Jun. 9, 2020 related to Taiwanese Application No. 108126670.
(Continued)

*Primary Examiner* — Ida M Soward
(74) *Attorney, Agent, or Firm* — Muncy, Geissler, Olds & Lowe, P.C.

(57) ABSTRACT

The present disclosure provides a semiconductor package structure. The semiconductor package structure includes a first die, at least a second die, an RDL disposed over the second die, a molding encapsulating the first die and the second die, a plurality of first conductors disposed in the molding, and a plurality of second conductors disposed in the second die. The first die has a first side and a second side opposite to the first side. The second die has a third side facing the first side of the first die and a fourth side opposite to the third side. The RDL is disposed on the fourth side of the second die. The first die is electrically connected to the RDL through the plurality of first conductors, and the second die is electrically connected to the RDL through the plurality of second conductors.

10 Claims, 9 Drawing Sheets

(51) Int. Cl.
H01L 25/18 (2006.01)
H01L 25/04 (2014.01)
H01L 25/07 (2006.01)
H01L 23/00 (2006.01)
H01L 25/00 (2006.01)
H01L 21/48 (2006.01)
H01L 21/56 (2006.01)
H01L 21/78 (2006.01)
H01L 25/075 (2006.01)

(52) U.S. Cl.
CPC .......... H01L 21/565 (2013.01); H01L 21/568 (2013.01); H01L 21/78 (2013.01); H01L 23/5383 (2013.01); H01L 23/5386 (2013.01); H01L 24/19 (2013.01); H01L 24/20 (2013.01); H01L 25/0652 (2013.01); H01L 25/18 (2013.01); H01L 25/50 (2013.01); H01L 24/25 (2013.01); H01L 25/043 (2013.01); H01L 25/0657 (2013.01); H01L 25/071 (2013.01); H01L 25/074 (2013.01); H01L 25/0756 (2013.01); H01L 2224/214 (2013.01); H01L 2224/224 (2013.01); H01L 2225/06503 (2013.01); H01L 2225/06513 (2013.01); H01L 2225/06541 (2013.01); H01L 2225/06548 (2013.01); H01L 2225/06555 (2013.01); H01L 2225/06586 (2013.01)

(58) Field of Classification Search
CPC ... H01L 25/0652; H01L 25/18; H01L 25/043; H01L 25/0657; H01L 25/074; H01L 25/0756; H01L 25/071; H01L 24/25; H01L 2225/06503; H01L 2225/06586; H01L 2225/06541; H01L 2224/224
See application file for complete search history.

(56) References Cited

U.S. PATENT DOCUMENTS

| | | | | |
|---|---|---|---|---|
| 8,878,360 B2 * | 11/2014 | Meyer | ...................... | H01L 24/24 257/734 |
| 8,883,561 B2 | 11/2014 | Park et al. | | |
| 8,895,440 B2 | 11/2014 | Choi et al. | | |
| 9,054,095 B2 * | 6/2015 | Pagaila | ............... | H01L 23/5389 |
| 9,111,870 B2 * | 8/2015 | Vincent | ................... | H01L 24/30 |
| 9,373,605 B1 * | 6/2016 | Wang | ................... | H01L 23/5385 |
| 9,443,824 B1 * | 9/2016 | We | ...................... | H01L 25/0655 |
| 9,496,196 B2 | 11/2016 | Yu et al. | | |
| 9,570,422 B2 * | 2/2017 | West | ................. | H01L 23/49816 |
| 9,761,559 B1 * | 9/2017 | Shih | ........................ | H01L 24/20 |
| 9,773,757 B2 * | 9/2017 | Yu | ........................ | H01L 24/14 |
| 9,966,360 B2 * | 5/2018 | Yu | ........................ | H01L 23/5384 |
| 10,128,212 B2 * | 11/2018 | Shih | ........................ | H01L 24/97 |
| 10,217,720 B2 * | 2/2019 | Wang | ..................... | H01L 25/50 |
| 10,347,574 B2 * | 7/2019 | Jeng | ........................ | H01L 24/20 |
| 10,522,470 B1 * | 12/2019 | Chang | ..................... | H01L 24/20 |
| 10,593,637 B2 * | 3/2020 | Kuan | ..................... | H01L 24/02 |
| 10,964,666 B2 * | 3/2021 | Yu | ........................ | H01L 21/568 |
| 2011/0291261 A1 | 12/2011 | Fleischman et al. | | |
| 2012/0038064 A1 * | 2/2012 | Camacho | ............ | H01L 21/4832 257/777 |
| 2012/0074585 A1 * | 3/2012 | Koo | ................... | H01L 23/49827 257/774 |
| 2012/0112322 A1 * | 5/2012 | Lin | ................... | H01L 21/76898 257/618 |
| 2012/0187565 A1 * | 7/2012 | Ewe | ........................ | H01L 24/29 257/774 |
| 2013/0043584 A1 * | 2/2013 | Kwon | ............... | H01L 23/49822 257/737 |
| 2013/0334697 A1 * | 12/2013 | Shin | ...................... | H01L 25/105 257/774 |
| 2014/0091471 A1 * | 4/2014 | Chen | ................... | H01L 21/6836 257/770 |
| 2014/0264831 A1 | 9/2014 | Meyer | | |
| 2015/0235994 A1 * | 8/2015 | Ohba | ...................... | H01L 24/97 257/676 |
| 2015/0348940 A1 * | 12/2015 | Woychik | ............... | H01L 23/481 257/774 |
| 2016/0079169 A1 * | 3/2016 | Uzoh | ............... | H01L 21/76898 257/750 |
| 2017/0047308 A1 * | 2/2017 | Ho | ....................... | H01L 23/5386 |
| 2017/0141053 A1 * | 5/2017 | Chen | ..................... | H01L 24/19 |
| 2018/0114783 A1 * | 4/2018 | Wang | ................ | H01L 23/49811 |
| 2018/0286812 A1 * | 10/2018 | Jain | ......................... | H01L 25/50 |
| 2019/0214347 A1 * | 7/2019 | Huang | .................... | H01L 24/92 |
| 2019/0252321 A1 * | 8/2019 | Braunisch | ............... | H01L 23/66 |
| 2019/0341351 A1 * | 11/2019 | May | ....................... | H01L 23/5385 |
| 2020/0286871 A1 * | 9/2020 | Lift | ....................... | H01L 23/5386 |
| 2020/0364600 A1 * | 11/2020 | Elsherbini | ............. | H01L 21/486 |
| 2020/0395335 A1 * | 12/2020 | Chen | ..................... | H01L 23/5389 |
| 2021/0020578 A1 * | 1/2021 | Jee | .......................... | H01L 24/19 |
| 2021/0082857 A1 * | 3/2021 | Chen | ..................... | H01L 24/83 |
| 2021/0111153 A1 * | 4/2021 | Lin | ......................... | H01L 25/50 |
| 2021/0111156 A1 * | 4/2021 | Elsherbini | ............. | H01L 25/105 |
| 2022/0102314 A1 * | 3/2022 | Chen | ..................... | H01L 24/82 |

OTHER PUBLICATIONS

Office Action and Search Report issued in CN-201911020268.0 dated Aug. 4, 2021, 6 pages.

* cited by examiner

SEMICONDUCTOR PACKAGE STRUCTURE HAVING STACKED DIE STRUCTURE

PRIORITY DATA

This patent application claims the benefit of U.S. Provisional Patent Application Ser. No. 62/782,712 filed Dec. 20, 2018, the entire disclosure of which is hereby incorporated herein by reference.

TECHNICAL FIELD

The present disclosure relates to a semiconductor package structure and a method for preparing the same, and more particularly, to a three-dimensional integrated circuit (3DIC) semiconductor package structure and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor packages.

In one approach, using a stack of at least two chips (or dies) in a 3D package to form, for example, a memory device, it is possible to produce a product having a memory capacity which is twice as large as that obtainable through other semiconductor integration processes. In addition to the increase in memory capacity, a stack package also provides improved mounting density and mounting area utilization efficiency. Due to such advantages, research and development of stack package technology has accelerated.

The manufacturing of semiconductor devices is becoming more complicated. The semiconductor device is assembled with a number of integrated components including various materials having different thermal properties. Because many components with different materials are combined, the complexity of the manufacturing operations of the semiconductor device is increased. Accordingly, there is a continuous need to improve the manufacturing process of semiconductor devices and address the above complexities.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor package structure. The semiconductor package structure includes a first die, at least a second die, a redistribution layer (RDL) disposed over the second die, a molding encapsulating the first die and the second die, a plurality of first conductors disposed in the molding, and a plurality of second conductors disposed in the second die. In some embodiments, the first die has a first side and a second side opposite to the first side. In some embodiments, the second die has a third side facing the first side of the first die and a fourth side opposite to the third side. The RDL is disposed on the fourth side of the second die. In some embodiments, the first die is electrically connected to the RDL through the plurality of first conductors, and the second die is electrically connected to the RDL through the plurality of second conductors.

In some embodiments, the semiconductor package structure further includes a plurality of conductive members disposed between the first side of the first die and the third side of the second die.

In some embodiments, the first die and the second die are bonded and electrically connected to each other by the plurality of conductive members.

In some embodiments, the molding has a fifth side facing the RDL and a sixth side opposite to the fifth side.

In some embodiments, the sixth side of the molding and the second side of the first die are coplanar.

In some embodiments, the semiconductor package structure further includes a plurality of connecting structures disposed over the RDL.

In some embodiments, the first die is a logic die. In some embodiments, the second die is a memory die.

In some embodiments, a die size of the first die is greater than a die size of the second die.

In some embodiments, the plurality of first conductors include a plurality of through molding vias (TMVs).

In some embodiments, the plurality of second conductors include a plurality of through silicon vias (TSVs).

One aspect of the present disclosure provides a method for preparing a semiconductor package structure. The method includes the following steps. A first die is provided. A second die including a plurality of first conductors is bonded to the first die. A plurality of second conductors are disposed on the first die. A molding is disposed to encapsulate the first die, the second die and the plurality of second conductors. An RDL is disposed on the second die and the molding. A plurality of connecting structures are disposed on the RDL.

In some embodiments, the method further includes attaching the first die on a carrier substrate prior to the bonding of the second die to the first die.

In some embodiments, the method further includes the following steps. The RDL, the molding, the first die and the second die are singulated after the forming of the connecting structures to form a package structure, and the semiconductor package structure is detached from the carrier substrate.

In some embodiments, the first die further includes a plurality of conductive members.

In some embodiments, the second die is bonded and electrically connected to the first die by the plurality of conductive members.

In some embodiments, the method further includes removing a portion of the molding to expose a surface of the second die and surfaces of the plurality of second conductors prior to the forming of the RDL.

In some embodiments, a die size of the first die is greater than a die size of the second die.

In some embodiments, the first die is a logic die. In some embodiments, the second die is a memory die.

In some embodiments, the plurality of first conductors include a plurality of TSVs.

In some embodiments, the plurality of second conductors include a plurality of TMVs.

In the present disclosure, a method for preparing the semiconductor package structure is provided. According to the method, the first die is electrically connected to the RDL through the plurality of TMVs, while the second die is electrically connected to the RDL through the plurality of TSVs. Accordingly, the electrical connection between elements within the semiconductor package structure are simplified. Significantly, the plurality of TMVs and the plurality of TSVs all extend vertically within the semiconductor package structure. Therefore, package size of the semiconductor package structure can be further reduced due to the vertical electrical connection.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
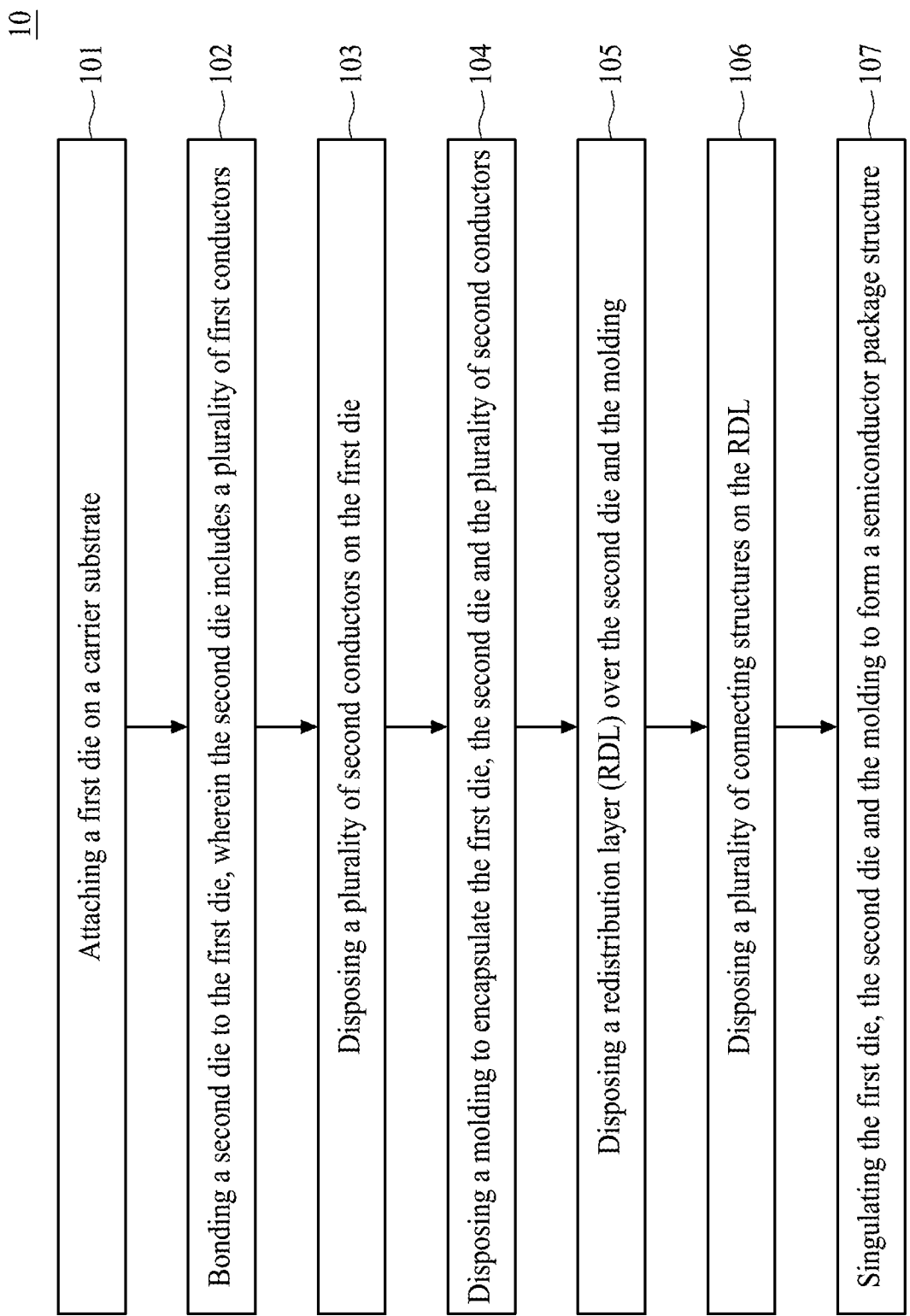
FIG. 1 is a flow diagram illustrating a method for preparing a semiconductor package structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method for preparing a semiconductor package structure in accordance with an embodiment of the present disclosure. The method for preparing a semiconductor structure 10 includes a step 101, attaching a first die on a carrier substrate. The method 10 further includes a step 102, bonding a second die to the first die. In some embodiments, the second die includes a plurality of first conductors. The method 10 further includes a step 103, disposing a plurality of second conductors on the first die. The method 10 further includes a step 104, disposing a molding to encapsulate the first die, the second die and the plurality of second conductors. The method 10 further includes a step 105, disposing an RDL over the second die and the molding. The method 10 further includes a step 106, disposing a plurality of connecting structures on the RDL. The method 10 further includes a step 107, singulating the first die, the second die and the molding to form a semiconductor package structure. The method for preparing the semiconductor package structure 10 will be further described according to one or more embodiments below.

Figure 2:
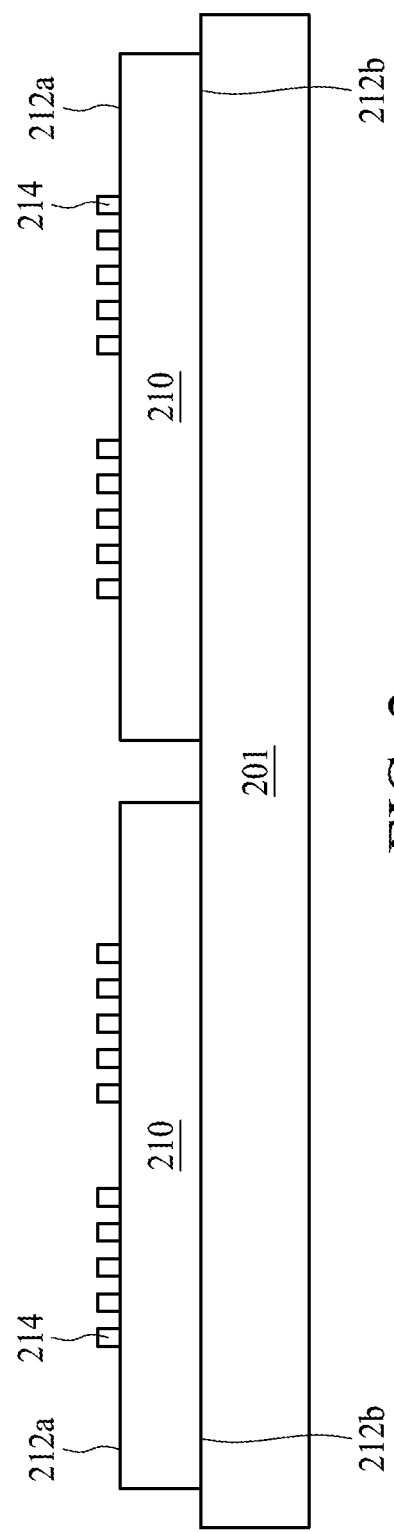
FIGS. 2 to 9 are schematic diagrams illustrating various fabrication stages of the method for preparing the semiconductor package structure in accordance with an embodiment of the present disclosure.

FIGS. 2 to 9 are schematic drawings illustrating various fabrication stages of the method for preparing the semiconductor package structure in accordance with an embodiment of the present disclosure. Referring to FIG. 2, a first die 210 is provided and attached to a carrier structure 201 according to step 101. In some embodiments, a plurality of first dies 210 can be attached to one carrier structure 201, but the disclosure is not limited thereto. In some embodiments, the first dies 210 are temporarily attached to the carrier substrate 201 by a release film (not shown). In some embodiments, the release film may be a fluorine-base film, a silicon-coated polyethylene terephthalate film, a polymethylpentene film, a polypropylene film, or another suitable material, but the disclosure is not limited thereto. In some embodiments, the carrier substrate 201 is configured to support a die, a chip or a package. In some embodiments, the carrier substrate 201 is a semiconductive substrate or a wafer. In some embodiments, the carrier substrate 201 is a silicon wafer, a glass wafer or the like.

In some embodiments, the first die 210 can be a die, a chip or a package. In some embodiments, the first die 210 is fabricated with a predetermined functional circuit within the first die 210 produced by photolithography processes. In some embodiments, the first die 210 is singulated from a semiconductive wafer by a mechanical blade or a laser blade. In some embodiments, the first die 210 includes a variety of electrical circuits suitable for a particular application. In some embodiments, the electrical circuits include various devices such as transistors, capacitors, resistors, diodes or the like. In some embodiments, the first die 210 includes any one of various known types of semiconductor devices to form an accelerated processing unit (APU), a central processing unit (CPU), a graphic processing unit (GPU), microprocessors, application-specific integrated circuits (ASICs), digital signal processors (DSPs), or the like. In some embodiments, the first die 210 can be a logic device die in accordance with the embodiments, but the disclosure is not limited thereto.

In some embodiments, the first die 210 includes a first side 212a and a second side 212b opposite to the first side 212a. In some embodiments, the first side 212a is a front side or an active side on which the circuits or electrical components are disposed. In some embodiments, the second side 212b is a back side or an inactive side where the circuits or electrical components are absent. As shown in FIG. 2, the first dies 210 are attached to the carrier substrate 201 by the second side 212b. The first die 210 further includes a plurality of conductive members 214 disposed over the first side 212a. In some embodiments, the plurality of conductive members 214 are electrically connected to the circuits or electrical components disposed in the first die 210.

Figure 3:
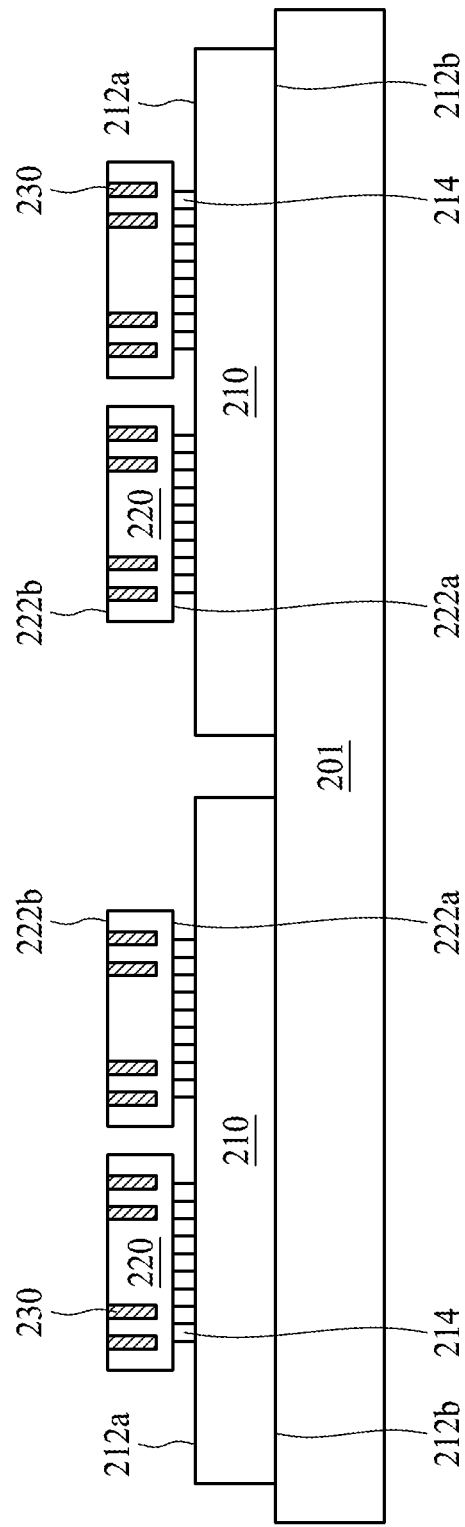

Referring to FIG. 3, at least a second die 220 is bonded to the first die 210 according to step 102. In some embodiments, a plurality of second dies 220 are disposed on one first die 210, as shown in FIG. 3, but the disclosure is not limited thereto. In some embodiments, a die size of the first die 210 is greater than a die size of the second die 220, but the disclosure is not limited thereto. In some embodiments, the second die 220 is a die, a chip or a package. In some embodiments, the second die 220 is fabricated with a predetermined functional circuit within the second die 220 produced by photolithography processes. In some embodiments, the second die 220 is singulated from a semiconductive wafer by a mechanical blade or laser blade. In some embodiments, the second die 220 comprises a variety of electrical circuits suitable for a particular application. In some embodiments, the electrical circuits include various devices such as transistors, capacitors, resistors, diodes or the like. In some embodiments, the second die 220 includes any one of various known types of semiconductor devices to form APU, memories, DRAM, NAND flash memory, CPU, GPU, microprocessors, ASICs, DSPs, or the like. In some embodiments, the second die 102 is a memory die, but the disclosure is not limited thereto. In some embodiments, the first die 210 and the second die 220 include identical or different types of semiconductor devices.

The second die 220 includes a third side 222a and a fourth side 222b opposite to the third side 222a. In some embodiments, the third side 222a is a front side or an active side on which the circuits or electrical components are disposed. In some embodiments, the fourth side 222b is a back side or an inactive side where the circuits or electrical components are absent. As shown in FIG. 3, the second dies 220 are bonded to the first die 210 by the third side 222a. Further, the second dies 220 are bonded and electrically connected to the first die 210 by the plurality of conductive members 214 disposed between the first side 212a of the first die 210 and the third side 222a of the second die 220, as shown in FIG. 3.

Significantly, the second die 220 includes a plurality of conductors 230 disposed therein. In some embodiments, the conductors 230 include a plurality of through silicon vias (TSVs) 230. In some embodiments, an interconnection structure (not shown) can be disposed over the third side 222a of the second die 220. In some embodiments, the plurality of TSVs 230 extend from the fourth side 222b to the third side 222a of the second die 220, and are electrically connected to the interconnection structure. In some embodiments, the second die 220 is electrically connected to the first die 210 through the interconnection structure and the plurality of conductive members 214. In some embodiments, the plurality of TSVs 230 are exposed through the fourth side 222b of the second die 220.

Figure 4:
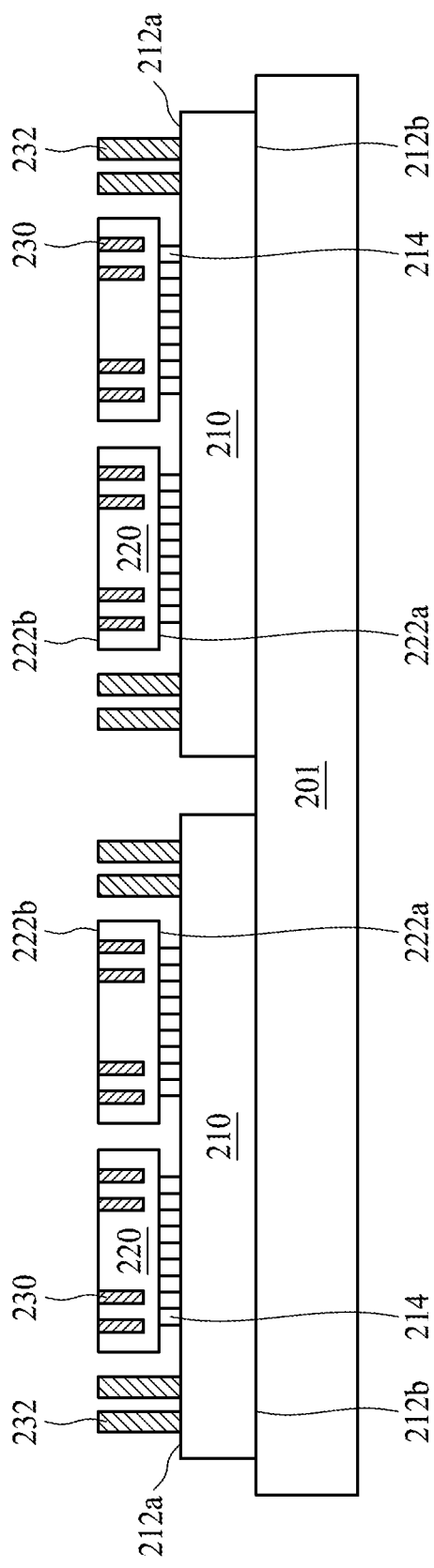

Referring to FIG. 4, a plurality of conductors 232 are disposed on the first die 210, according to step 103. In some embodiments, the plurality of conductors 232 are conductive pillars disposed on the first side 212a of the first die 210. In some embodiments, the conductive pillars 232 are disposed over a die pad or a terminal of the first die 210 and electrically connect the die pad or the terminal to a component external to the first die 210. In some embodiments, the conductive pillars 232 include conductive material such as copper (Cu), silver (Ag) or gold (Au). In some embodiments, the conductive pillars 232 are of a cylindrical shape. In some embodiments, a cross section of the conductive pillars 232 can include a circular, rectangular, quadrilateral or polygonal shape, but the disclosure is not limited thereto. In some embodiments, a height of the conductive pillars 232 is substantially the same as a sum of a thickness of the second die 220 and a height of the conductive member 214 but the disclosure is not limited thereto.

Figure 5:
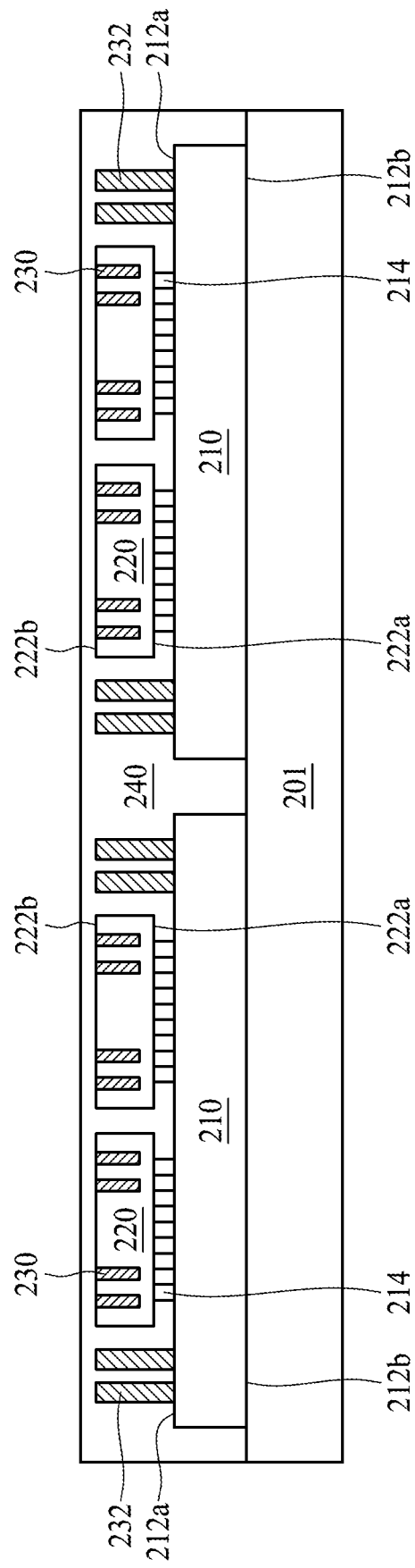

Referring to FIG. 5, a molding 240 is disposed to encapsulate the first die 210, the second die 220 and the plurality of conductive pillar 232, according to step 104. As shown in FIG. 5, the molding 240 may be disposed over the carrier substrate 201 to surround the first die 210, the second die 220 and the plurality of conductive pillars 232. In some embodiments, the molding 240 can be a single-layer film or a composite stack. In some embodiments, the molding 104 includes various materials, such as molding compound, molding underfill, epoxy, resin, or the like. In some embodiments, the molding 240 has a high thermal conductivity, a low moisture absorption rate and a high flexural strength. In addition, the first die 210, the second die 220 and the plurality of conductive pillars 232 can be entirely embedded or encapsulated within the molding 240, as shown in FIG. 5.

Figure 6:
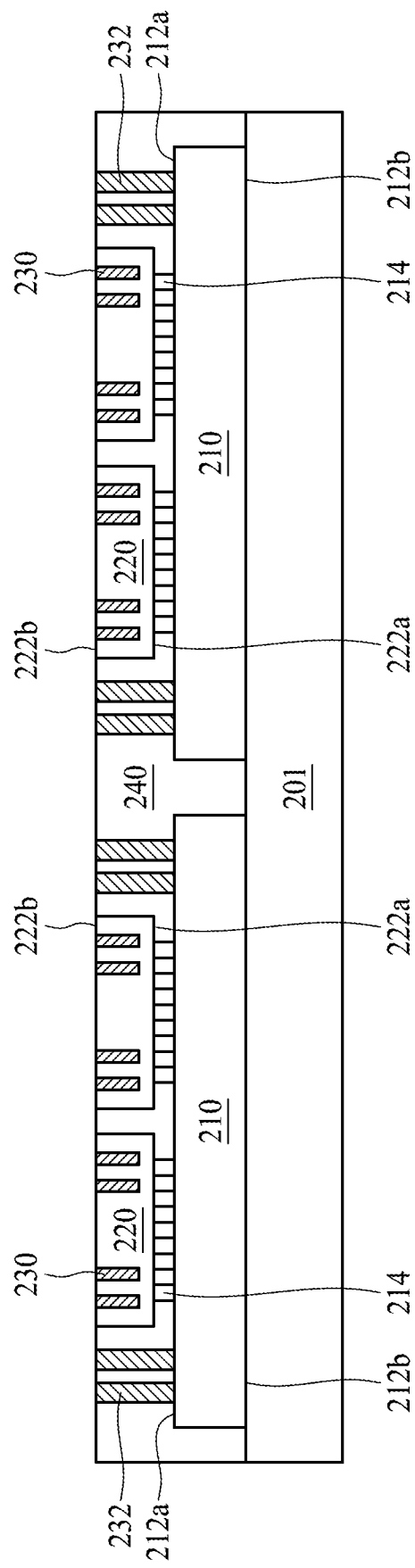

Referring to FIG. 6, in some embodiments, step 104 further includes removing a portion of the molding 240 to expose a surface of the second die 220 and surfaces of the plurality of conductive pillars 232. In some embodiments, the molding 240 is grinded back until the surface of the second die 220 over the fourth side 222b and end surfaces of the plurality of conductive pillars 232 are exposed.

Figure 7:
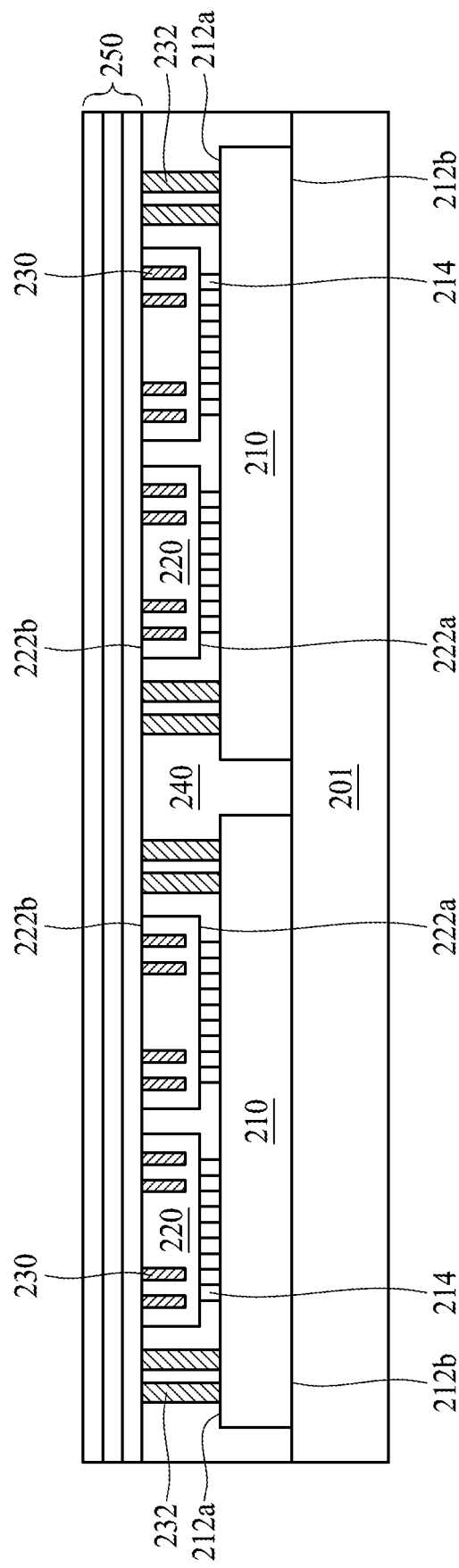

Referring to FIG. 7, an RDL 250 is disposed on the second die 220 and the molding 240, according to step 105. In some embodiments, the RDL 250 can include a dielectric stack (not shown) and several conductive lines (not shown) disposed in the dielectric stack. The conductive lines electrically connect conductive terminals (not shown) on two opposite sides of the RDL 250. The conductive lines are also used to form an electrical connection between the plurality of conductors 230 and external components (not shown), and between the plurality of conductive pillars 232 and the external components. In some embodiments, the conductive lines are made of Cu, Au, Ag, nickel (Ni), tin (Sn), lead (Pb), tungsten (W), aluminum (Al), titanium (Ti), palladium (Pd), solder, or alloys thereof, but the disclosure is not limited thereto.

Figure 8:
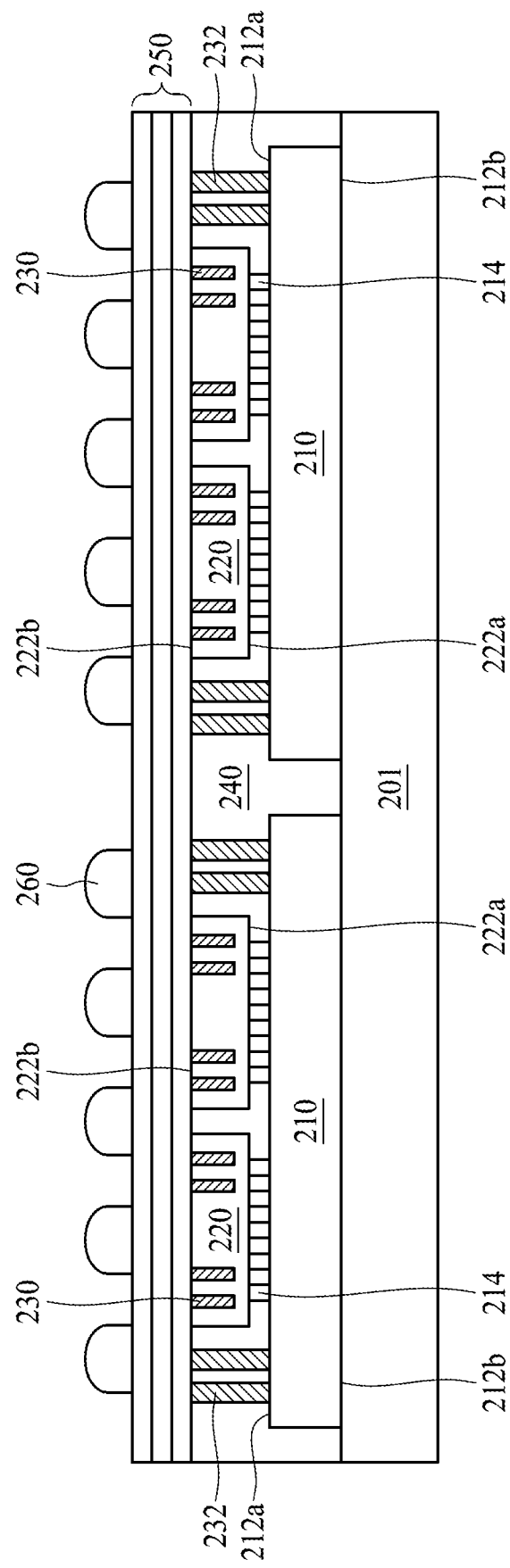

Referring to FIG. 8, a plurality of connecting structures 260 are disposed on the RDL 250, according to step 106. In some embodiments, the plurality of connecting structures 260 are disposed on a side of the RDL 250, while the first die 210, the second die 220 and the plurality of conductive pillars 232 are disposed on a side of the RDL 250 opposite to the plurality of connecting structures 260. In some embodiments, the plurality of connecting structures 260 are conductive bumps, which include conductive material such as solder, Cu, Ni or Au, but the disclosure is not limited thereto. In some embodiments, the plurality of connecting structures 260 are solder balls, ball grid array (BGA) balls, controlled collapse chip connection (C4) bumps, microbumps, or pillars, but the disclosure is not limited thereto. In some embodiments, the connecting structures 260 can have a spherical, hemispherical or cylindrical shape, but the disclosure is not limited thereto.

Figure 9:
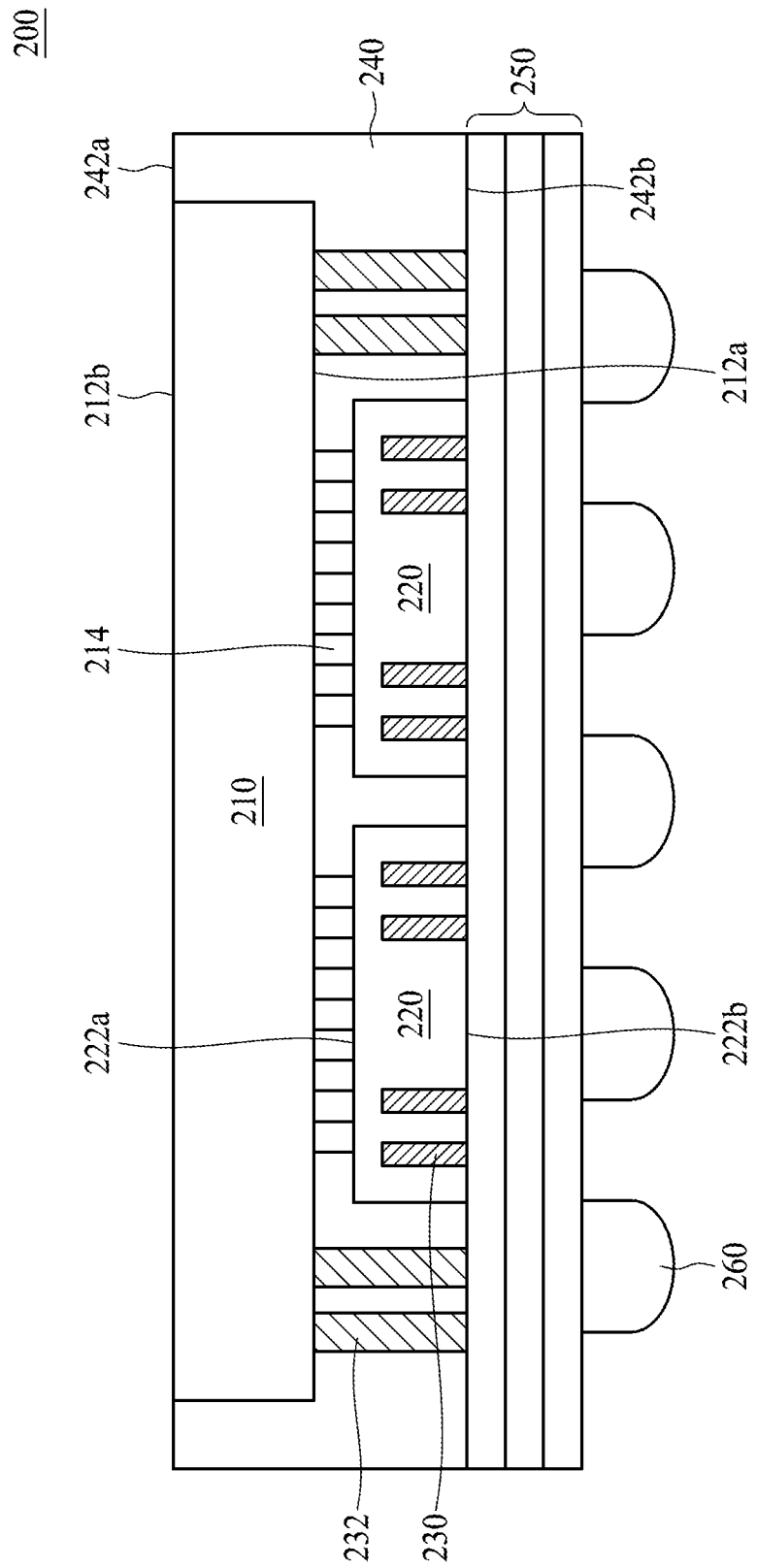

Referring to FIG. 9, in the embodiment, the first die 210, the second dies 220 over the first die 210, and the molding 240 are singulated after the forming of the connecting structures 260, according to step 107. Consequently, a semiconductor package structure 200 is formed. Further, the semiconductor package structure 200 can be detached from the carrier substrate 201, according to step 108. Additionally, the semiconductor package structure 200 can be flipped, as shown in FIG. 9.

Still referring to FIG. 9, the semiconductor package structure 200 includes a first die 210, at least a second die 220, a molding 240 encapsulating at least the first die 210 and the second die 220, an RDL 250, a plurality of conductors 230 disposed in the second die 220, and a plurality of conductors 232 disposed in the molding 240. As shown in FIG. 9, the first die 210 has a first side 212a and a second side 212b opposite to the first side 212a. In some embodiments, the first side 212a is an active side, over which the circuits or electrical components are disposed. The second die 220 has a third side 222a facing the first side 212a of the first die 210, and a fourth side 222b opposite to the third side 222a. As mentioned above, the third side 222a of the second die 220 is an active side over which the circuits or electrical components are disposed. Further, the plurality of conductors 230 disposed in the second die 220 extend from the fourth side 222b to the third side 222a. The plurality of conductors 230 are exposed through the fourth side 222b of the second die 220. As mentioned above, the plurality of conductors 230 disposed in the second die 220 are a plurality of TSVs. The second die 220 is electrically connected to the RDL 250 by the plurality of TSVs. The plurality of conductors 232 are disposed in and encapsulated by the molding 240. In other words, the plurality of conductors 232 extend vertically within the molding 240 and electrically connect the first die 210 to the RDL 250. Accordingly, the plurality of conductors 232 extending in the molding 240 are referred to as TMVs. Further, the semiconductor package structure 200 includes a plurality of conductive members 214 disposed between the first die 210 and the second die 220. The first die 210 and the second die 220 are therefore bonded and electrically connected to each other by the plurality of conductive members 214. The semiconductor package structure 200 further includes a plurality of connecting structures 260 disposed on the RDL 250. As shown in FIG. 9, the plurality of connecting structures 260 are disposed over a side of the RDL 250 that is opposite to the first die 210, the second die 220, the plurality of conductors 232 and the molding 240. The plurality of connecting structures 260 provides electrical connection between the semiconductor package structure 200 and external components.

As shown in FIG. 9, the molding 240 has an upper side 242a and a bottom side 242b opposite to the upper side 242a. The bottom side 242b of the molding 240 is in contact with the RDL 250, while the upper side 242a of the molding 240 and the second side 212b of the first die 210 are coplanar, as shown in FIG. 9. Additionally, sidewalls of the first die 210 and sidewalls of the second die 220 are in contact with the molding 240 in some embodiments, but the disclosure is not limited thereto.

In some embodiments, the first die 210 can be a logic die, while the second die 220 can be a memory die, but the disclosure is not limited thereto. In some embodiments, a die size of the first die 210 is greater than a die size of the second die 220, but the disclosure is not limited thereto.

Still referring to FIG. 9, in some embodiments, the first die 210 is electrically connected to the RDL 250 through the plurality of conductors 232 (i.e., the TMVs), while the second die 220 is electrically connected to the RDL 250 through the plurality of conductors 230 (i.e., the TSVs).

In the present disclosure, a method for preparing the semiconductor package structure 10 is provided. According to the method 10, the plurality of conductors 230 are formed to provide electrical connection between the second die 220 and the RDL 250, the plurality of conductors 232 are formed to provide electrical connection between the first die 210 and the RDL 250, and the plurality of conductive members 214 are formed to provide electrical connection between the first die 210 and the second die 220. Accordingly, the electrical connections between elements (e.g., the first die 210 and the second die 220) within the semiconductor package structure 200 and external components are simplified. Significantly, the plurality of conductors 230 and the plurality of conductors 232 all extend vertically within the semiconductor package structure 200. Therefore, package size of the semiconductor package structure 200 can be further reduced due to the vertical electrical connection.

One aspect of the present disclosure provides a semiconductor package structure. The semiconductor package structure includes a first die, at least a second die, an RDL disposed over the second die, a molding encapsulating the first die and the second die, a plurality of first conductors disposed in the molding, and a plurality of second conductors disposed in the second die. In some embodiments, the first die has a first side and a second side opposite to the first side. In some embodiments, the second die has a third side facing the first side of the first die and a fourth side opposite to the third side. The RDL is disposed on the fourth side of the second die. In some embodiments, the first die is electrically connected to the RDL through the plurality of first conductors, and the second die is electrically connected to the RDL through the plurality of second conductors.

One aspect of the present disclosure provides a method for preparing a semiconductor package structure. The method includes the following steps. A first die is provided. A second die including a plurality of first conductors is bonded to the first die. A plurality of second conductors are disposed on the first die. A molding is disposed to encapsulate the first die, the second die and the plurality of second conductors. An RDL is disposed on the second die and the molding. A plurality of connecting structures are disposed on the RDL.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor package structure, comprising:
a first die having a first side and a second side opposite to the first side;
a plurality of second die bonded and electrically connected to the first die, each of the plurality of second die having a third side facing the first side of the first die and a fourth side opposite to the third side;
a redistribution layer (RDL) disposed on the fourth side of each of the plurality of second die;
a molding encapsulating the first die and the plurality second dies;
a plurality of first conductors disposed on the first side of the first die and disposed in the molding; and
a plurality of second conductors disposed in each of the plurality of second die;
wherein the first die is electrically connected to the RDL through the plurality of first conductors, and each of the plurality of second die is electrically connected to the RDL through the plurality of second conductors.

2. The semiconductor package structure of claim 1, further comprising a plurality of conductive members disposed between the first side of the first die and the third side of each of the plurality of second die.

3. The semiconductor package structure of claim 2, wherein the first die is bonded and electrically connected to the plurality of second die by the plurality of conductive members.

4. The semiconductor package structure of claim 1, wherein the molding has a fifth side facing the RDL and a sixth side opposite to the fifth side.

5. The semiconductor package structure of claim 4, wherein the sixth side of the molding and the second side of the first die are coplanar.

6. The semiconductor package structure of claim 1, further comprising a plurality of connecting structures disposed on the RDL.

7. The semiconductor package structure of claim 1, wherein the first die is a logic die, and the plurality of second die are memory die.

8. The semiconductor package structure of claim 1, wherein a die size of the first die is greater than a die size of the plurality of second die.

9. The semiconductor package structure of claim 1, wherein the plurality of first conductors comprise a plurality of through molding vias (TMVs).

10. The semiconductor package structure of claim 1, wherein the plurality of second conductors comprise a plurality of through silicon vias (TSVs).

* * * * *